United States Patent
Shimamura et al.

(10) Patent No.: US 6,208,223 B1
(45) Date of Patent: Mar. 27, 2001

(54) RECEIVING FILTER OF A SAW SEPARATOR WITH GREATER ELECTRODE INTERDIGITATED WIDTH IN FIRST STAGE PARALLEL RESONATOR

(75) Inventors: Hajime Shimamura; Yoshiaki Fujita; Masaaki Umezawa; Tomokazu Komazaki, all of Tokyo (JP)

(73) Assignee: Oli Electric Industry, Co., Ltd. (JP)

( * ) Notice: Subject to any disclaimer, the term of this patent is extended or adjusted under 35 U.S.C. 154(b) by 0 days.

(21) Appl. No.: 09/210,746

(22) Filed: Dec. 15, 1998

(30) Foreign Application Priority Data

Mar. 6, 1998 (JP) .................................................. 10-054600

(51) Int. Cl.$^7$ ...................................................... H03H 9/64
(52) U.S. Cl. ........................ 333/193; 333/133; 310/313 B
(58) Field of Search ..................................... 333/193–196, 333/133; 310/313 R, 313 B, 313 C, 313 D

(56) References Cited

U.S. PATENT DOCUMENTS

| | | | |
|---|---|---|---|
| 5,115,216 | * | 5/1992 | Hikita et al. ........................... 333/195 |
| 5,600,287 | * | 2/1997 | Kwan et al. ........................... 333/195 |
| 5,796,205 | * | 8/1998 | Nishihara et al. ................. 310/313 R |
| 5,864,262 | * | 1/1999 | Ikada ..................................... 333/193 |
| 5,909,156 | * | 6/1999 | Nishihara et al. .................... 333/193 |
| 5,914,646 | * | 6/1999 | Hashimoto ............................ 333/195 |

FOREIGN PATENT DOCUMENTS

| | | | |
|---|---|---|---|
| 6-29799 | | 2/1994 | (JP) . |
| 7-74584 | * | 3/1995 | (JP) ..................................... 333/193 |
| 9-205343 | * | 8/1997 | (JP) ..................................... 333/193 |
| 10-303698 | * | 11/1998 | (JP) ..................................... 333/193 |

* cited by examiner

*Primary Examiner*—Benny Lee
*Assistant Examiner*—Barbara Summons
(74) *Attorney, Agent, or Firm*—Venable; Robert J. Frank; James R. Burdett

(57) ABSTRACT

A receiving filter of a SAW separator that prevents temperature increase, and enables to improve electric power-resisting property and attains high performance. A series arms and parallel arms of a transmitting filter and receiving filter are equipped with ladder type filters comprising SAW resonators. In the receiving filter, the number of pairs of finger electrodes of a parallel arm resonator P1 arranged at the first stage viewed from input side is larger than the number of pairs of finger electrodes of parallel arm resonators P2, . . . at other stages. Or interdigitated width of finger electrodes of the parallel resonator at the first stage is made longer than interdigitated width of finger electrodes of each of parallel resonators at other stages.

14 Claims, 8 Drawing Sheets

RECEIVING FILTER OF A SAW SEPARATOR WITH GREATER ELECTRODE INTERDIGITATED WIDTH IN FIRST STAGE PARALLEL RESONATOR

BACKGROUND OF THE INVENTION

1. Field of the Invention

The present invention relates to a surface acoustic wave (SAW) receiving filter to be used in a radio frequency (RF) filter that is used in compact mobile communication devices such as cellular phones and so forth.

2. Description of Related Art

Recently the development of compact-size and lightweight mobile communication device terminals such as cellular phones and so forth has been progressed. Along with the development, compact size and high performance of parts to be used therein are required, and so is the development of SAW elements.

Since a SAW separator is a device that will greatly contribute to making an RF portion compact, there is a great demand for its practical applications.

An RF portion shown in FIG. 7 comprises an antenna 101, an ANT terminal 102 that is connected to the above antenna, a transmitting filter 103 and a separator line 107 that are respectively connected to the above ANT terminal, a transmitting terminal (Tx terminal) 104 that is connected to the above transmitting filter, an electric power amplifier 105 that is connected to the above transmitting terminal, a receiving filter 108 that is connected to the above separator line, and a receiving terminal (Rx terminal) 109 that is connected to the above receiving filter.

The SAW separator 110 comprises the transmitting filter 103, the receiving filter 108 and the separator line 107, and such a SAW separator are required to have its characteristics including compact size, low insertion loss of a pass band, large attenuation in an attenuation band, and so on.

Since the SAW separator 110 is arranged at output line of the electric power amplifier 105 at the final stage, electric power load from 1 to 2 W is imposed on the transmitting filter 103, while electric power load around 1 W is imposed on the receiving filter 108, therefore, excellent electric power-resisting property is required to the SAW separator.

Conventionally, a dielectric wave separator has been used in such a field and apt to make volume large, which has been a problem with the prior art.

In the transmitting filter 103 and the receiving filter 108, used in general is a ladder type filter as shown in FIG. 8. The filter is equipped with series arm SAW resonators S1, S2 and S3, and parallel arm SAW resonators P1, P2, P3 and P4. The series arm SAW resonator S1 at a first stage has interdigitated width of 50 μm and number of pairs of 100, the series arm SAW resonator S2 at a second stage has interdigitated width of 50 μm and number of pairs of 100, and the series arm SAW resonator S3 at a third stage has interdigitated width of 50 μm and number of pairs of 100. The parallel arm SAW resonator P1 at a first stage has interdigitated width of 70 μm and number of pairs of 70, the parallel arm SAW resonator P2 at a second stage has interdigitated width of 110 μm and number of pairs of 80, the parallel arm SAW resonator P3 at a third stage has interdigitated width of 110 μm and number of pairs 80, and the parallel arm SAW resonator P4 at a fourth stage has interdigitated width of 70 μm and number of pairs of 70.

FIG. 9 is a diagram showing a symbol of each of the respective SAW resonators (S1–S3, P1–P4) in FIG. 8, and FIG. 10 is a diagram showing a lumped parameter equivalent circuit therein. These respective resonators are arranged with their comb-shape electrodes or interdigital electrodes mutually engaged as shown in FIG. 11.

In FIG. 11, reference numerals 10a and 10b show comb-shape type electrodes or interdigital electrodes, and they are engaged with each other, and reference numeral 12 shows a pair of finger electrodes, while the code D shows a inter-digitated width of the finger electrodes.

Usually, each of the resonators has finite Q, and there will occur electric power loss that decreases this Q value. A resistance component that causes this electric power loss generates heat when electric power is supplied to the resonator, and this heat causes damage on electrodes. This fact is known to those skilled in the art. Especially in the case of a receiving filter of a SAW separator, attention should be given to heat generating at electrodes of a parallel arm at a first stage.

In the circuit structure shown in FIG. 8, in order to prevent the above damage, a method wherein the number of pairs of the input stage resonator S1 of series arm is made larger than the number of each of other series arm resonators S2 and S3 is known in the field. (Refer to, for example, Japanese Unexamined Patent Publication (TOKKAIHEI) No.6 (1994)-29779.)

However, in the above receiving filter of conventional SAW separator, no measures are taken on the number of pairs in parallel arm resonators. Accordingly, when electric power is applied to a parallel arm resonator at a first stage, heat is generated or released in electrodes at the first stage, and the heat causes damage on electrodes, which has been a problem to the conventional SAW separator.

For example, a receiving filter of the structure shown in FIG. 8 has been employed in a SAW separator. When electric power is applied to the SAW separator, a transmitting filter and a receiving filter employed in the SAW separator are broken.

A ladder type filter shown in FIG. 8 is well known as one wherein comb-shape electrodes are melted off owing to heat generated by current flowing through series arms (S1, S2, S3) and parallel arms (P1, P2, P3, P4). Especially in operating a cellular phone, parallel arms in a receiving filter of a SAW separator generate more heat than series arms. The parallel arm at a first stage generates heat most among the respective parallel arms, whereby electrodes of parallel arms are broken, and consequently the receiving filter is broken. Accordingly, measures to enhance electric power-resisting properties of parallel arms (P1, P2, P3, P4) have been required.

In view of the above circumstances, an object of the present invention is to provide a receiving filter of a SAW separator with high resistance to electric power and with high performance by preventing temperature thereof from rising.

SUMMARY OF THE INVENTION

In order to achieve the above object, according to a first aspect of the present invention, there is provided a receiving filter that is used in a SAW separator and that comprises a ladder type filter, wherein the ladder type filter has plural stages of series arms and plural stages of parallel arms wherein each of the input side stages thereof is the first stage and each of the output side stages thereof is the last stage, each of the series arms and parallel arms comprises a SAW resonator, the parallel arm at the first stage comprises one SAW resonator as a parallel arm resonator, and the number of pairs of finger electrodes of the parallel arm resonator at the first stage is made larger than the number of pairs of finger electrodes of each of the parallel arm resonators at other stages.

According to a second aspect of the present invention, there is provided a receiving filter that is used in a SAW separator and that comprises a ladder type filter, wherein the ladder type filter has plural stages of series arms and plural stages of parallel arms wherein each of the input side stages thereof is the first stage and each of the output side stages thereof is the last stage, each of the series arms and parallel arms comprises a SAW resonator, the parallel arm at the first stage comprises one SAW resonator as a parallel arm resonator, and the interdigitated width of finger electrodes of the parallel arm resonator at the first stage is made longer than intergigitated width of finger electrodes of each of the parallel arm resonators at other stages.

According to a third aspect of the present invention, there is provided a receiving filter that is used in a SAW separator and that comprises a ladder type filter, wherein the ladder type filter has plural stages of series arms and plural stages of parallel arms wherein each of the input side stages thereof is the first stage and each of the output side stages thereof is the last stage, each of the series arms and parallel arms comprises a SAW resonator, the parallel arm at the first stage comprises a series circuit of plural SAW resonators as a parallel arm resonator, and the number of pairs of finger electrodes of the parallel arm resonator at the first stage is made larger than the number of pairs of finger electrodes of each of the parallel arm resonators at other stages.

According to a fourth aspect of the present invention, there is provided a receiving filter that is used in a SAW separator and that comprises a ladder type filter, wherein the ladder type filter has plural stages of series arms and plural stages of parallel arms wherein each of the input side stages thereof is the first stage and each of the output side stages thereof is the last stage, each of the series arms and parallel arms comprises a SAW resonator, the parallel arm at the first stage comprises a series circuit of plural SAW resonators as a parallel arm resonator, and interdigitated width of finger electrodes of parallel arm resonator at the first stage is made larger than interdigitated width of the finger electrodes of each of the parallel arm resonators at other stages.

In any of the structures mentioned above, it is possible to make a structure wherein preferably both the number of pairs and interdigitated width of finger electrodes of an interdigital electrode at the first stage are made larger and longer than those of finger electrodes of interdigital electrodes at other stages.

According to a receiving filter of each of the structures mentioned above under the present invention, current flowing through each of finger electrodes of comb-shape electrodes of the parallel arm resonator arranged at a first stage may be reduced, and temperature is prevented from rising thereat. As a consequence, it is possible to reduce an electric resistance value of the whole comb-shape electrodes, and also to prevent temperature thereof from increasing.

BRIEF DESCRIPTION OF THE DRAWINGS

The foregoing and other objects, features and advantages of the present invention will be better understood from the following description taken in connection with the accompanying drawings, in which.

DESCRIPTION OF THE PREFERRED EMBODIMENTS

With reference to the drawings, preferred embodiments according to the present invention will hereinafter be explained in detail.

Figure 1:
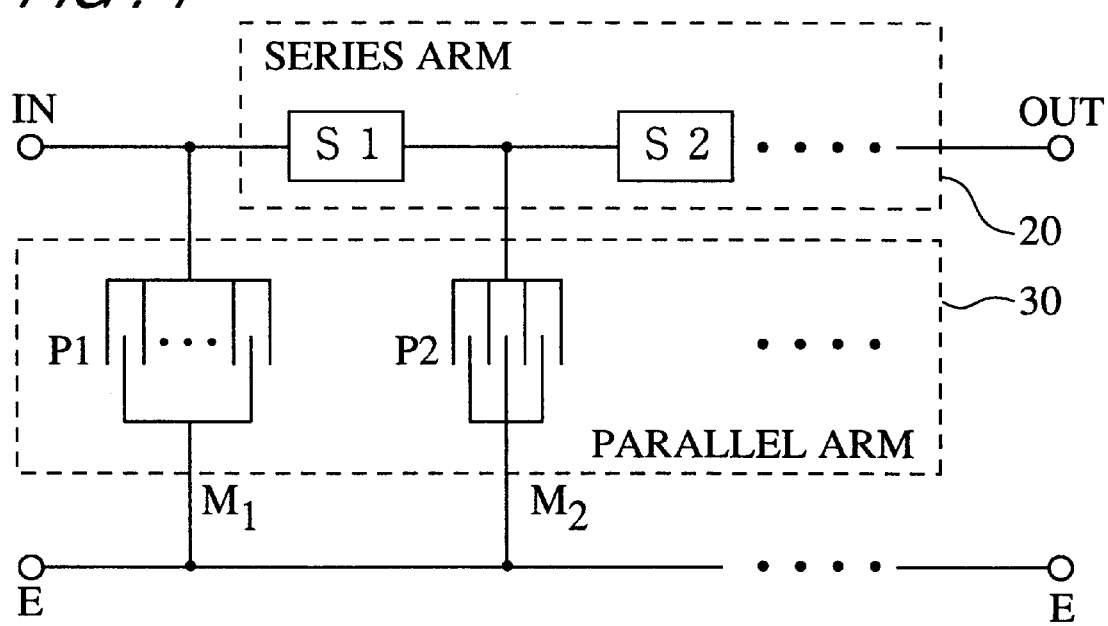
FIG. 1 is a schematic diagram showing a structure of a receiving filter of a SAW separator as a first preferred embodiment of the present invention.

FIG. 1 is a schematic diagram showing a structure of a receiving filter of a SAW separator as a first preferred embodiment of the present invention.

In the structure according to the first preferred embodiment, a receiving filter of a SAW separator is a ladder type filter comprising SAW resonators. The receiving filter is equipped with a series arm 20 and a parallel arm 30. The SAW resonators constituting the series arm are referred to as series arm resonators S1, S2, S3, . . . , respectively. The SAW resonators constituting the parallel arm are referred to as parallel arm resonators P1, P2, P3, . . . , respectively. The series arm and the parallel arm of the receiving filter comprise plural stages. In each of the arms, a stage at an input terminal (IN, E) side is defined as a first stage, and a stage at an output terminal (OUT, E) side is defined as a last stage. In the preferred embodiment, the first stage comprises one SAW resonator.

Further, the number of pairs of finger electrodes of a parallel arm resonator P1 arranged at the first stage is made larger than the number of pairs of finger electrodes of each of the parallel arm resonators P2, . . . , at other stages.

By the way, the number of pairs of finger electrodes is shown by $M_i$ (i=1, 2, . . . ). While interdigitated width of finger electrodes is shown by $D_i$ (i=1, 2, . . . ).

Herein, the number of pairs $M_1$ of finger electrodes of the parallel arm resonator P1 at the first stage is set at 140 (pairs), and the number of pairs $M_2$, . . . of finger electrodes of each of the parallel arm resonators P2, . . . in the following stages is set at 80 (pairs). By the way, except for the structure of the parallel arm resonator P1, the structure of the receiving filter of the standard SAW separator shown in FIG. 8 may be used as it is without modification thereof.

As mentioned above, according to the first preferred embodiment of the present invention, the number of pairs $M_1$ of finger electrodes in comb-shape electrodes of the parallel arm resonator P1 arranged at the first stage is increased, so that the current flowing through each of finger electrodes will be reduced, and thus, increase in temperature thereof will be avoided.

Namely, even if the total amount of current flowing through a parallel arm resonator is same as that in a conventional structure, the current density per one finger electrode is reduced in proportion to increase in the number of pairs of finger electrodes. Accordingly, the heat release value of each finger electrode is reduced. As a consequence, the heat release value and temperature per unit finger electrode, and the heat release value and temperature of the whole parallel arm are lower than those of a conventional structure.

Therefore, according to the first preferred embodiment of the present invention, it is possible to improve the electric power-resisting property of the receiving filter.

Next, explanations will be given to a second preferred embodiment according to the present invention.

Figure 2:
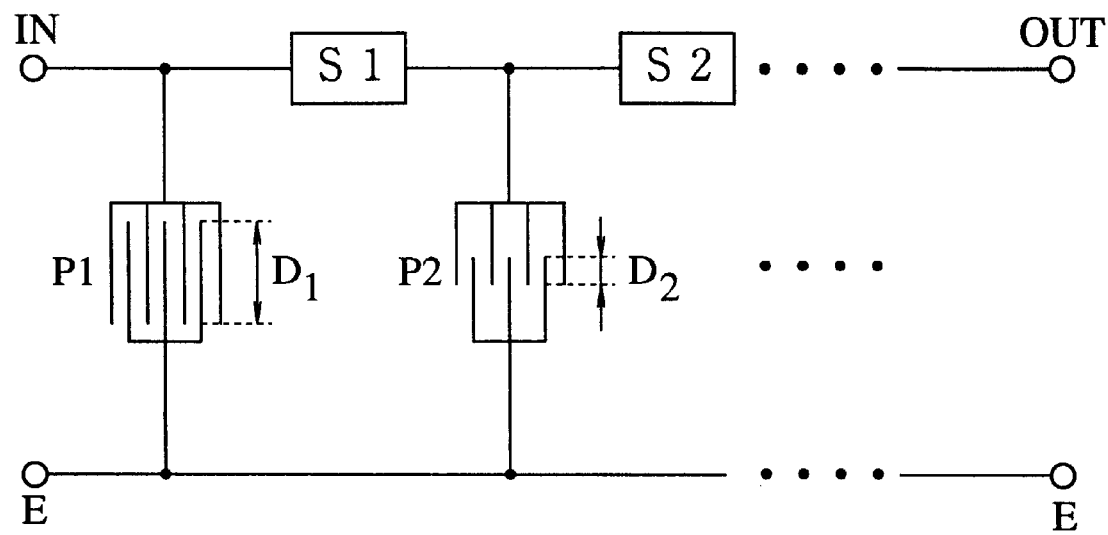
FIG. 2 is a schematic diagram showing a structure of a receiving filter of a SAW separator as a second preferred embodiment of the present invention.

FIG. 2 is a schematic diagram showing a structure of a receiving filter of a SAW separator as the second preferred embodiment of the present invention.

In the structure according to the second preferred embodiment, like the structure of the above-mentioned first preferred embodiment, a first stage is constructed by one SAW resonator, and interdigitated width $D_1$ of finger electrodes of a parallel arm resonator P1 arranged at the first stage is made longer than interdigitated width $D_2$, . . . , of finger electrodes of each of parallel arm resonators P2, . . . , at other stages.

Herein, the interdigitated width $D_1$ of the finger electrodes of the parallel arm resonator P1 is set at 140 μm, while the interdigitated width $D_2$ of the finger electrodes of each of the parallel arm resonators P2, . . . , are set at 110 μm. By the way, except for the structure of the parallel arm resonator P1, the structure of a receiving filter of a standard SAW separator shown in FIG. 8 may be used as it is without modification thereof.

As mentioned above, according to the second preferred embodiment of the present invention, interdigitated width of finger electrodes in comb-shape electrodes or interdigital electrodes of the parallel arm resonator P1 arranged at the first stage is increased, thereby reducing the current flowing through each of the finger electrodes, and avoiding increase in temperature thereof.

Accordingly, like in the above-mentioned first preferred embodiment, even if the total amount of current flowing through a parallel arm resonator is same as that in a conventional structure, the heat release value and temperature per unit finger electrode, and the heat release value and temperature of the whole parallel arm are reduced respectively as compared with the case of a conventional structure. As a result, according to the second preferred embodiment of the present invention, it is possible to improve the electric power-resisting property of the receiving filter.

In the next, explanations will be given to a third preferred embodiment according to the present invention hereinafter.

Figure 3:
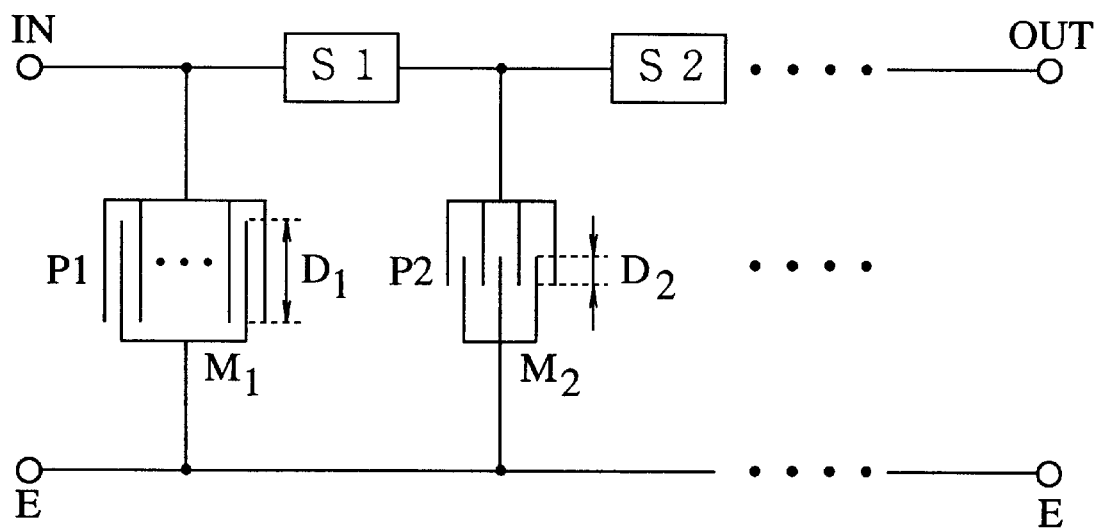
FIG. 3 is a schematic diagram showing a structure of a receiving filter of a SAW separator as a third preferred embodiment of the present invention.

FIG. 3 is a schematic diagram showing a structure of a receiving filter of a SAW separator as the third preferred embodiment of the present invention.

In the structure according to the third preferred embodiment, a first stage comprises one SAW resonator, and the number of pairs $M_1$ and the interdigitated width $D_1$ of finger electrodes of the parallel arm resonator P1 arranged at the first stage are made larger and longer respectively, than the number of pairs $M_2$, . . . , and interdigitated width $D_2$, . . . , of finger electrodes of each of the parallel arm resonators P2, . . . , at other stages.

The interdigitated width $D_1$ of the finger electrodes of the parallel arm resonator P1 is set at 140 μm, and the number of pairs $M_1$ thereof is set at 140 (pairs). The interdigitated width $D_2$ of the finger electrodes of each of the parallel arm resonators P2, . . . , is set at 110 μm, respectively, and the number of pairs $M_2$ thereof is set at 80 (pairs). By the way, except for the structure of the parallel arm resonator P1, the structure of the receiving filter of the standard SAW separator shown in FIG. 8 may be used as it is without modification thereof.

As mentioned above, according to the third preferred embodiment of the present invention, the number of pairs and interdigitated width of finger electrodes in comb-shape electrodes of the parallel arm resonator P1 arranged at the first stage are increased, thereby reducing current flowing through each of the finger electrodes, and avoiding increase in temperature thereof.

As a consequence, like the above-mentioned first and second preferred embodiments, according to the third preferred embodiment of the present invention, it is possible to improve the electric power-resisting property of the receiving filter.

A fourth preferred embodiment according to the present invention will hereinafter be explained.

Figure 4:
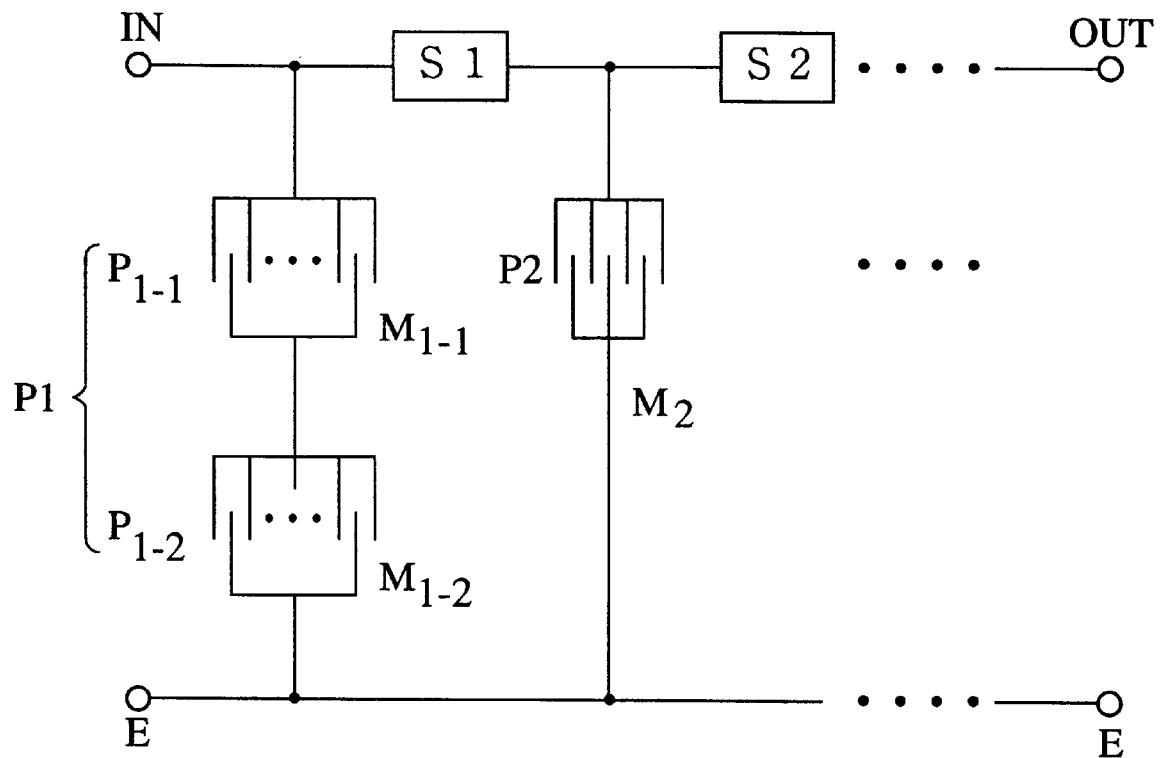
FIG. 4 is a schematic diagram showing a structure of a receiving filter of a SAW separator as a fourth preferred embodiment of the present invention.

FIG. 4 is a schematic diagram showing a structure of a receiving filter of a SAW separator as the fourth preferred embodiment of the present invention.

In the structure according to the fourth preferred embodiment, different from the above-mentioned first through third preferred embodiments, a first stage comprises plural SAW resonators. In the fourth preferred embodiment, a series circuit comprising two SAW resonators is employed. The number of pairs $M_{1\text{-}1}$ and $M_{1\text{-}2}$ of finger electrodes of each of plural parallel arm resonators $P_{1\text{-}1}$ and $P_{1\text{-}2}$, which are arranged at the first stage and connected in series to each other, is made larger than the number of pairs $M_2$, . . . , of the finger electrodes of each of the parallel arm resonators P2, . . . , at other stages.

In a structural example, the number of parallel arm resonators, which are arranged at the first stage on the input side and connected in series to each other, is two units. For instance, the number of pairs $M_{1-1}$ and $M_{1-2}$ of the finger electrodes of the first and second parallel arm resonators (P1: $P_{1-1}$, $P_{1-2}$) which are arranged at the first stage and connected in series to each other, is set at 140 (pairs), and the number of pairs $M_2$, ..., of the finger electrodes of each of the parallel arm resonators P2, ..., is set at 80 (pairs). By the way, except for the structure of the parallel arm resonator P1, the structure of a receiving filter of a standard SAW separator shown in FIG. 8 may be used as it is without any modification thereof.

As mentioned above, according to the fourth preferred embodiment of the present invention, two parallel arm resonators are arranged at the first stage on the input side and connected in series to each other, and the number of pairs of the finger electrodes of comb-shape electrodes is made larger than those of parallel arm resonators at other stages. As a result, the electric voltage that is applied to the series circuit is divided by the first and second parallel arm resonators $P_{1-1}$ and $P_{1-2}$ to provide them with lower voltage, respectively. Therefore, the current flowing through each of the finger electrodes of the first and second parallel arm resonators may be reduced, and accordingly, increase in temperature of the first and second parallel arm resonators may be prevented.

Consequently, like the above-mentioned first preferred embodiment, according to the fourth preferred embodiment of the present invention, it is possible to improve resistance to the electric power of the receiving filter.

Next, explanations will be given to a fifth preferred embodiment according to the present invention.

Figure 5:
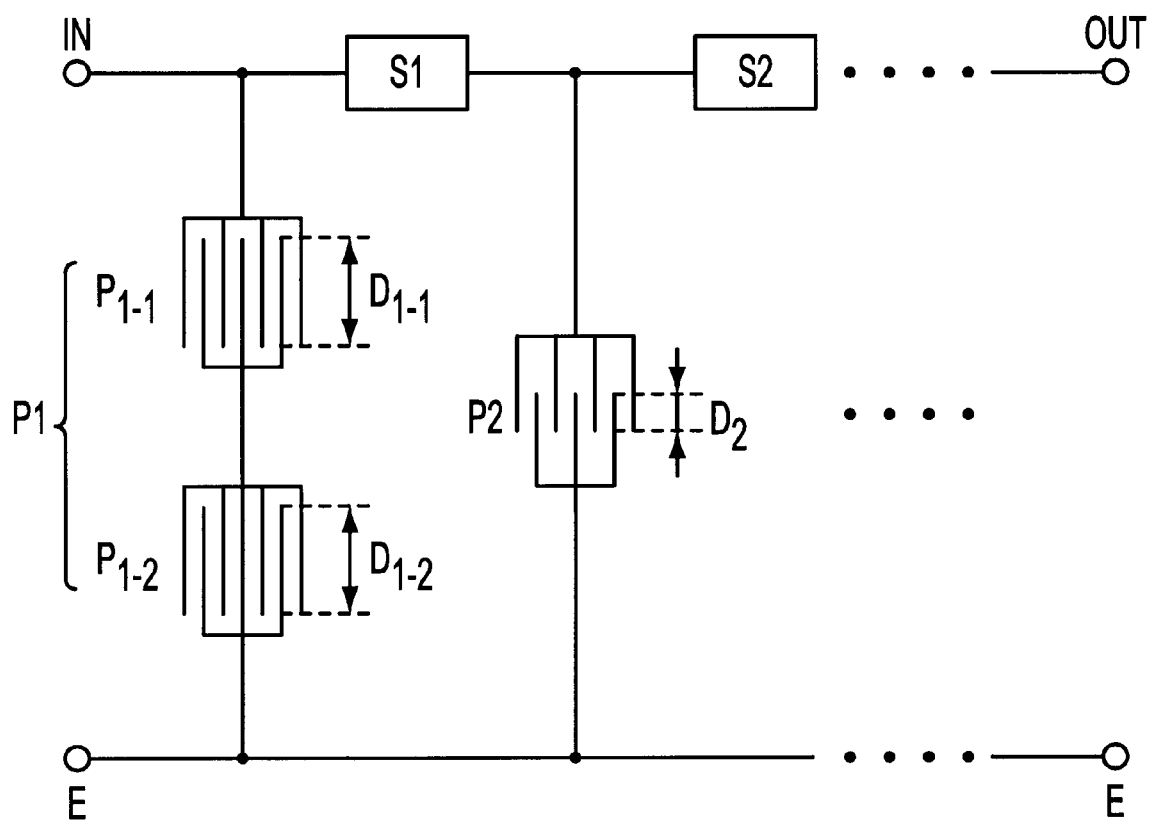
FIG. 5 is a schematic diagram showing a structure of a receiving filter of a SAW separator as a fifth preferred embodiment of the present invention.

FIG. 5 is a schematic diagram showing a structure of a receiving filter of a SAW separator as the fifth preferred embodiment of the present invention.

In the structure according to the fifth preferred embodiment, like the structure of the above-mentioned fourth preferred embodiment, a first stage comprises a series circuit comprising two units of SAW resonators. Interdigitated widths $D_{1-1}$ and $D_{1-2}$ of finger electrodes of plural parallel arm resonators $P_{1-1}$ and $P_{1-2}$, which are arranged at a first stage on the input side and connected in series to each other, are made longer than interdigitated widths $D_2$, ..., of finger electrodes of parallel arm resonators P2, ..., at other stages.

According to the structural example, two parallel arm resonators are arranged at the first stage on the input side and connected in series to each other. For instance, interdigitated widths $D_{1-1}$ and $D_{1-2}$ of the finger electrodes of the first and second parallel arm resonators (P1: $P_{1-1}$, $P_{1-2}$) are set at 140 $\mu$m respectively, and the interdigitated widths $D_2$ of the finger electrodes of the parallel arm resonators P2, ..., at other stages are set at 110 $\mu$m. By the way, except for the structure of the parallel arm resonator P1, the structure of a receiving filter of a standard SAW separator shown in FIG. 8 may be used as it is without any modification thereof.

As mentioned above, according to the fifth preferred embodiment of the present invention, two parallel arm resonators are arranged at the first stage and connected in series to each other, and the interdigitated width of finger electrodes of the comb-shaped electrodes is made longer than those of the parallel arm resonators at other stages. As a consequence, the electric voltage that is applied to the series circuit is divided by the first and second parallel arm resonators $P_{1-1}$ and $P_{1-2}$ to provide them with lower voltage, respectively. Therefore, the current flowing through each of the finger electrodes of the first and second parallel arm resonators may be reduced, and accordingly, increase in temperature of the first and second parallel arm resonators may be prevented.

As a result, like the above-mentioned second preferred embodiment, according to the fifth preferred embodiment of the present invention, it is possible to improve resistance to the electric-power of the receiving filter.

Next, explanations will be given to a sixth preferred embodiment according to the present invention hereinafter.

Figure 6:
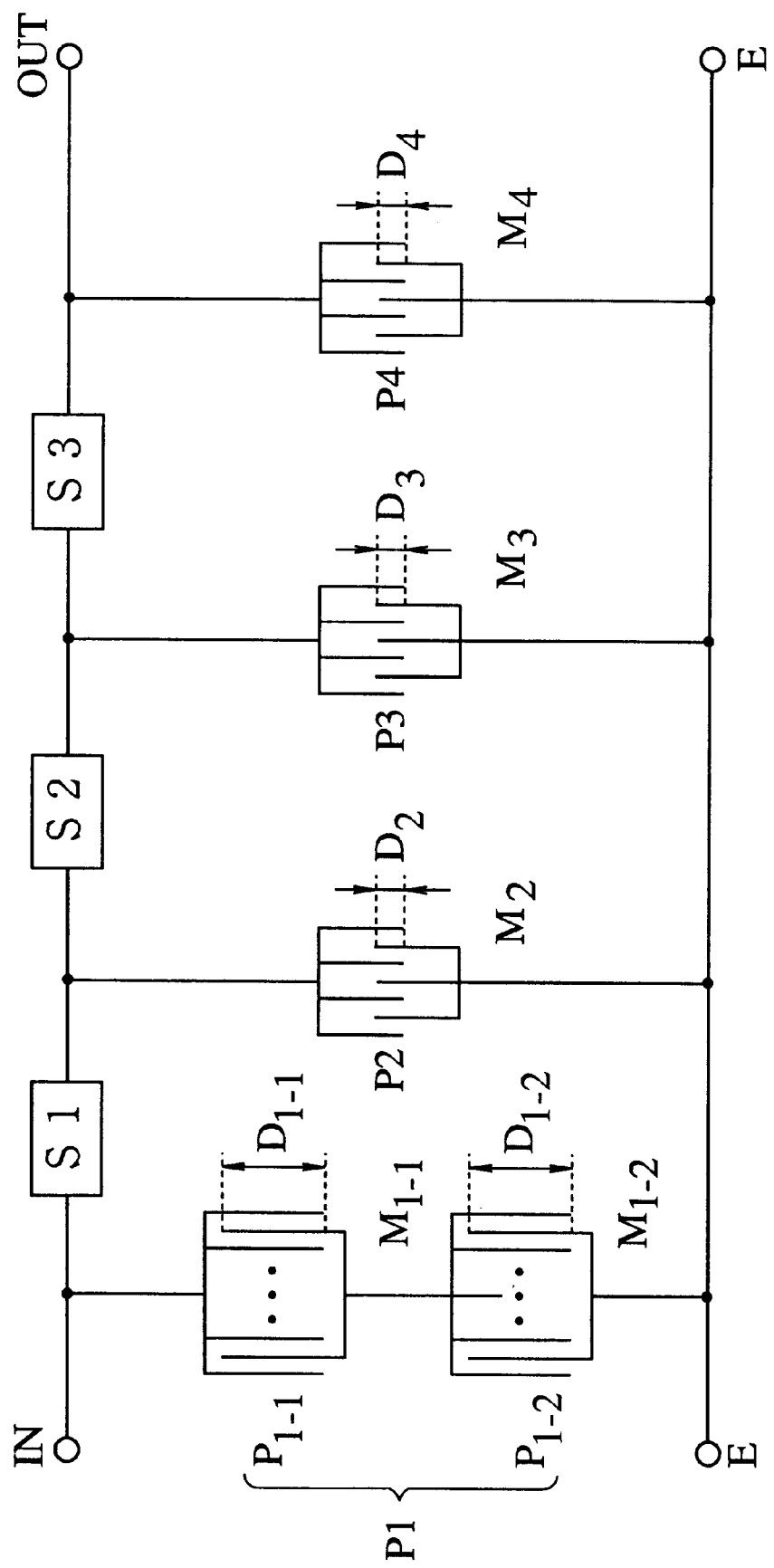
FIG. 6 is a schematic diagram showing a structure of a receiving filter of a SAW separator as a sixth preferred embodiment of the present invention.

FIG. 6 is a schematic diagram showing a structure of a receiving filter of a SAW separator as the sixth preferred embodiment of the present invention.

In the structure according to the sixth preferred embodiment, like the structure of the above-mentioned fourth and fifth preferred embodiments, a first stage comprises a series circuit having two SAW resonators connected to each other. The numbers of pairs $M_{1-1}$ and $M_{1-2}$ and interdigitated widths $D_{1-1}$ and $D_{1-2}$ of finger electrodes of the first and second parallel arm resonators (P1: $P_{1-1}$, $P_{1-2}$) which are arranged at a first stage and connected in series to each other, are made larger and longer, respectively than the numbers of pairs $M_2$, $M_3$ and $M_4$ and interdigitated widths $D_2$, $D_3$ and $D_4$ of parallel arm resonators P2, P3 and P4.

In the structural example as shown in FIG. 6, the receiving filter of the SAW separator is equipped with, for example, three series arm SAW resonators S1, S2 and S3. Additionally, interdigitated width and the number of pairs of each of the series arm resonators S1, S2 and S3 are respectively set as follows. S1: interdigitated width of 50 $\mu$m and the number of pairs of 100, S2: interdigitated width of 50 $\mu$m and the number of pairs of 100, and S3: interdigitated width of 50 $\mu$m and the number of pairs of 100. In addition, the receiving filter is equipped with, for example, four parallel arm resonators P1 ($P_{1-1}$, $P_{1-2}$), P2, P3 and P4. Interdigitated width and the number of pairs of each of the parallel arm resonators P1 ($P_{1-1}$, $P_{1-2}$), P2, P3 and P4 are set as follows, respectively. $P_{1-1}$: interdigitated width $D_{1-1}$ of 140 $\mu$m and the number of pairs $M_{1-1}$ of 140, $P_{1-2}$: interdigitated width $D_{1-2}$ of 140 $\mu$m, and the number of pairs $M_{1-2}$ of 140, P2: interdigitated width $D_2$ of 110 $\mu$m, and the number of pairs $M_2$ of 80, P3: interdigitated width $D_3$ of 110 $\mu$m, and the number of pairs $M_3$ of 80, and P4: interdigitated width $D_4$ of 70 $\mu$m, and the number of pairs $M_4$ of 70.

As mentioned above, according to the sixth preferred embodiment of the present invention, two parallel arm resonators are arranged at the first stage on the input side and connected in series to each other, and the number of pairs and the interdigitated width of the finger electrodes of each of the comb-shape electrodes are made larger and longer respectively than those of parallel arm resonators at other stages. As a consequence, the electric voltage that is applied to the series circuit is divided by the first and second parallel arm resonators $P_{1-1}$ and $P_{1-2}$ to provide them with lower voltages, respectively. Therefore, the current flowing through each of the finger electrodes of the first and second parallel arm resonators may be reduced to prevent temperature thereof from increasing.

As a result, like the above-mentioned first and second preferred embodiments, according to the sixth preferred embodiment of the present invention, it is possible to improve resistance to the electric power of the receiving filter.

In the meanwhile, whether a receiving filter can maintain its high performance or not depends on whether characteristics of the receiving filter changes or not when electrodes of a conventional structure at the first stage of parallel arm are changed into electrodes of an innovative structure having resistance to electric power. If the characteristics of the receiving filter do not change between the conventional structure and the innovative one, then it leads to that the receiving filter maintains its high performance. This corresponds to a case where the equivalent LC value (L: inductance and C: capacitance) of a first stage parallel arm having electric power-resisting finger electrodes is made approximately the same as that of a first stage parallel arm having conventional finger electrodes. As a consequence, by determining the number of pairs and interdigitated width of finger electrodes without changing the equivalent LC value of the parallel arm resonators arranged at the first stage, it is possible to maintain the high performance characteristics of a SAW resonator.

On the basis of the data obtained through experiments, it will hereinafter be explained concretely that it is possible to improve electric power-resisting properties, and also to maintain high performance characteristics of a SAW separator.

In the following explanations, a conventional receiving filter used for comparison has the structure shown in FIG. 8 having the number of stages, the number of pairs and the interdigitated width already explained. A receiving filter of the present invention may be any of the structures defined in the above preferred embodiments, but as a representative, the structure according to the sixth preferred embodiment explained with reference to FIG. 6 was employed.

Figure 8:
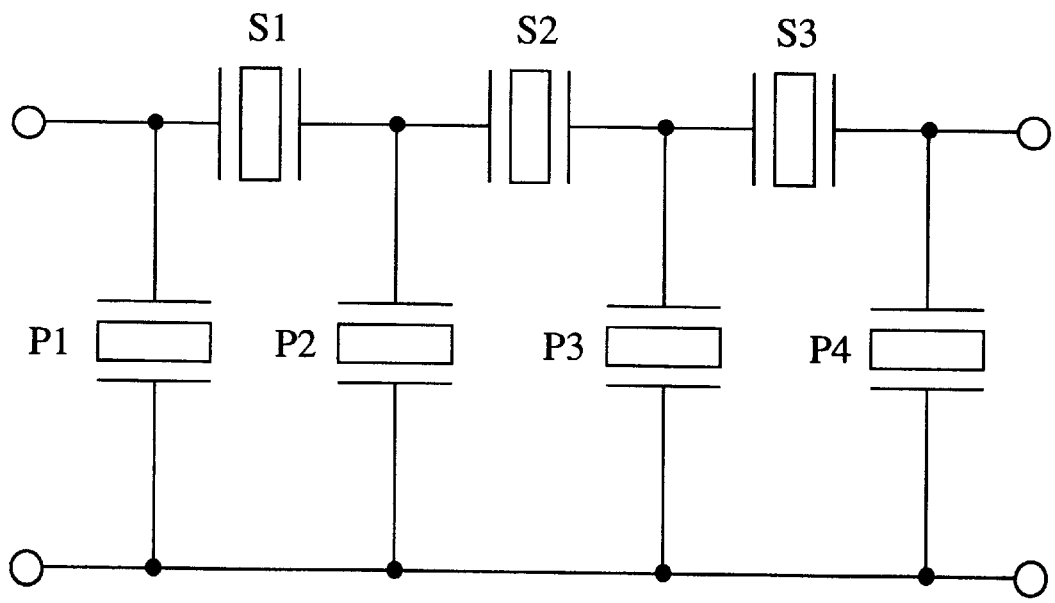
FIG. 8 is a circuit diagram of a ladder type filter to be used in a transmitting filter and receiving filter.

First, the electric current flowing through each of series arm and parallel arm of a receiving filter in a usual SAW separator shown in FIG. 8 is obtained.

Figure 9:
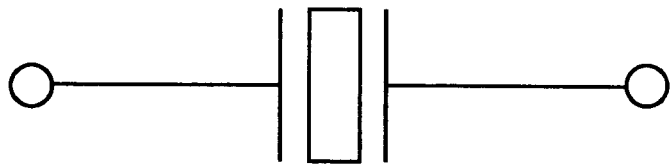
FIG. 9 is a circuit symbol diagram showing a SAW resonator to be used in a ladder type filter.
Figure 9:
Figure 10:
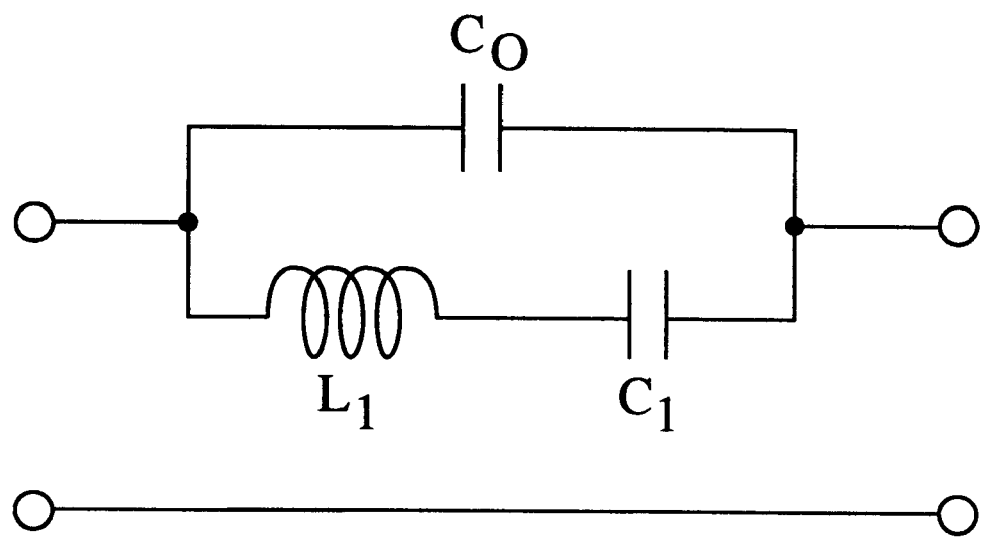
FIG. 10 is a equivalent circuit diagram of a SAW resonator to be used in a ladder type filter.
Figure 11:
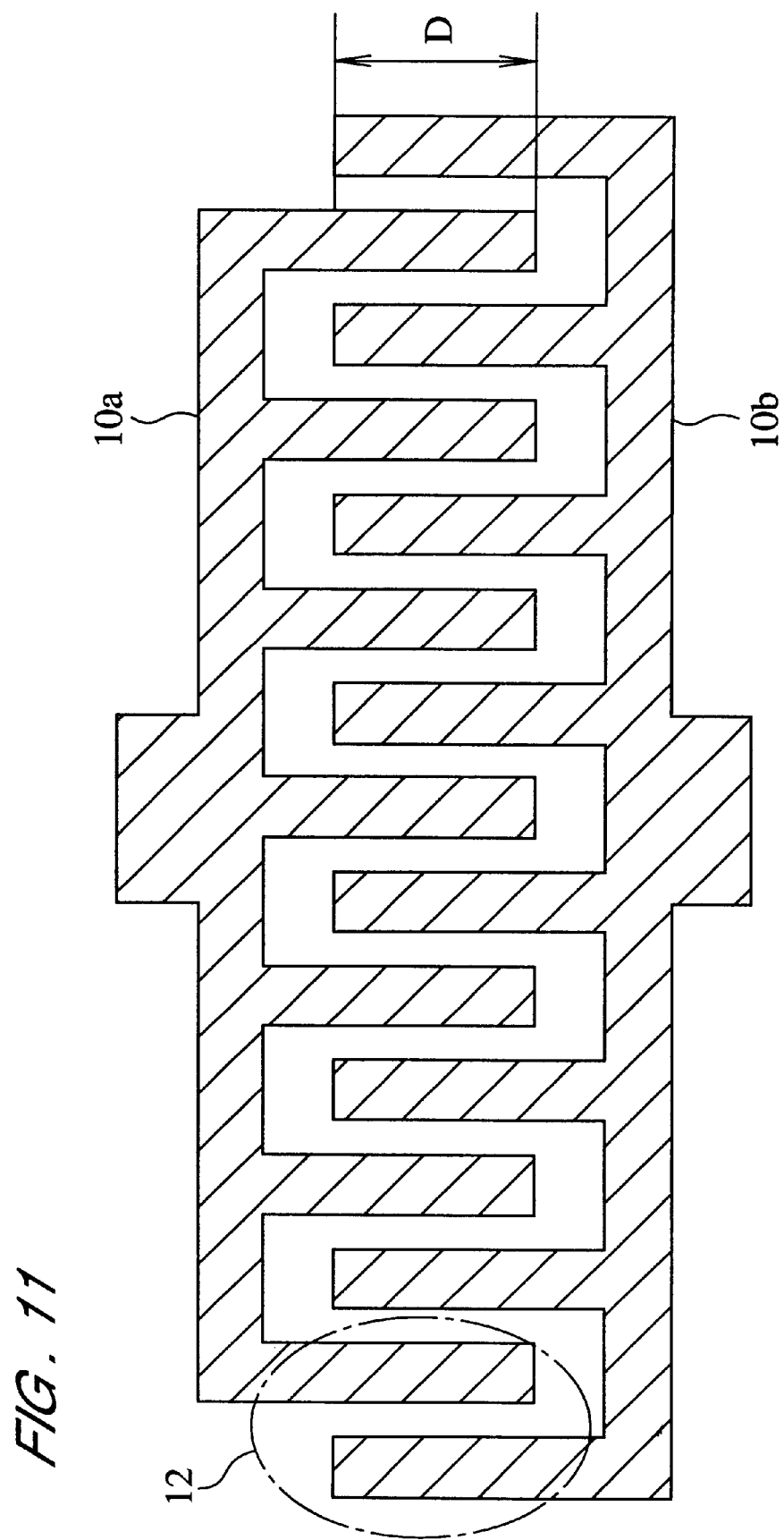
FIG. 11 is a plane view showing one example of a structure of comb-shape electrodes or interdigital electrodes in a SAW resonator to be used in a ladder type filter.

The resistance value of each resonator of the receiving filter of the SAW separator is obtained from the Q values and the equivalent LC values of respective resonators. FIG. 9 is a symbol showing each of SAW resonators, while FIG. 10 is a diagram showing a lumped parameter equivalent circuit of each of the SAW resonators. The admittance Y of the lumped parameter equivalent circuit in FIG. 10 is given by the following equation (1):

$$Y=[WC_0+(1+W^2L_1C_1)\times WC_1/(1-W^2L_1C_1)^2]/Q+jY_0 \quad (1)$$

wherein, $W=2\pi f$, $Y_0$: admittance in the case of $Q=\infty$, $C_0$: static capacitance, $C_1$: motional capacitance, $L_1$: motional inductance.

Figure 12:
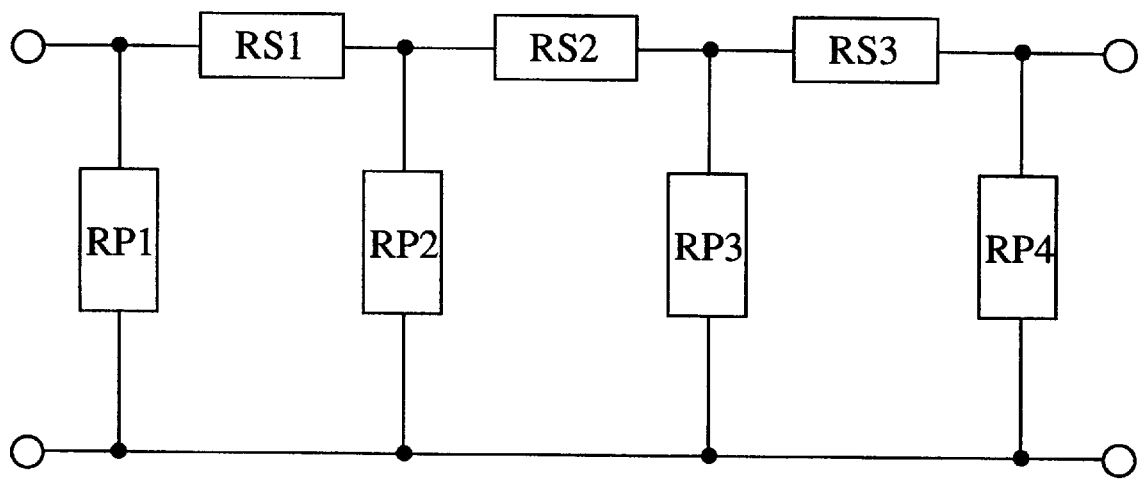
FIG. 12 is an equivalent circuit diagram of a receiving filter of a usual SAW separator shown in FIG. 7.

FIG. 12 is an equivalent circuit diagram of a receiving filter of a usual SAW separator mentioned above.

In this figure, RS1 is a resistance value of a series arm resonator arranged at a first stage, RS2 is a resistance value of a series arm resonator arranged at a second stage, RS3 is a resistance value of a series arm resonator arranged at a third stage, and RP1 is a resistance value of a parallel arm resonator arranged at a first stage, RP2 is a resistance value of a parallel arm resonator arranged at a second stage, RP3 is a resistance value of a parallel arm resonator arranged at a third stage, and RP4 is a resistance value of a parallel arm resonator arranged at a fourth stage.

The series arms and the parallel arms in the lumped parameter equivalent circuit of the receiving filter shown in FIG. 8 have series arm resistance values shown in TABLE 1, and parallel arm resistance values shown in TABLE 2, at the central frequency [f0=836.6 (MHz)] of transmitting band.

TABLE 1

| | RS1(Ω) | RS2(Ω) | RS3(Ω) | Remarks |
|---|---|---|---|---|
| f0 = 836.6 (MHz) - resistance value | 0.3632 | 0.3632 | 0.3632 | |

TABLE 2

| | RP1(Ω) | RP2(Ω) | RP3(Ω) | RP4 (Ω) |
|---|---|---|---|---|
| f0 = 836.6 (MHz) - resistance value | 1.268 | 0.5906 | 0.6339 | 1.268 |

Figure 13:
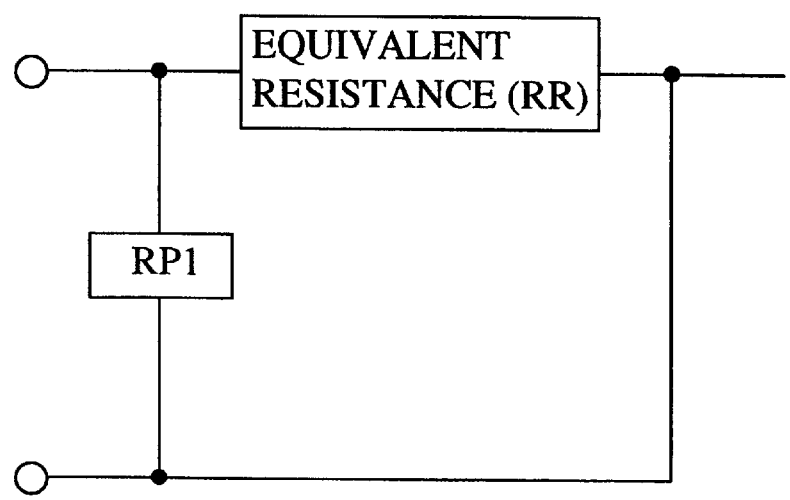
FIG. 13 is a diagram showing an electrical resistance value of a parallel arm resonator arranged at a first stage of a receiving filter of a SAW separator, and a synthetic resistance excluding the parallel arm resonator arranged at the first stage.

FIG. 13 is a diagram showing the resistance value of the parallel arm resonator arranged at the first stage of the receiving filter of the SAW separator shown in FIG. 12, and the synthetic resistance of the parallel arm resonators other than the parallel arm resonator arranged at the first stage.

As shown in FIG. 13, the resistance value RP1 of the parallel arm resonator arranged at the first stage and the synthetic resistance RR of other parallel arm resonators than the above parallel arm resonator arranged at the first stage are shown.

The resistance value (RP1) of the parallel arm resonator arranged at the first stage is as shown below:

$$RP1=1.268 \ (\Omega) \quad (2)$$

While the synthetic resistance (RR) of other parallel arm resonators than the parallel arm resonator arranged at the first stage is as shown below:

$$RR=0.7060 \ (\Omega) \quad (3)$$

As is apparent from the values of RP1 and RR, the resistance value RP1 of the parallel arm resonator P1 arranged at the first stage is about 1.8 times as large as the synthetic resistance RR of the parallel arm resonators other than the parallel arm resonator P1 arranged at the first stage. Therefore, with respect to the electric power-resisting property of the receiving filter, attention should be paid to the parallel arm resonator P1 arranged at the first stage. When electric power is applied to the receiving filter, current flows through the resistor of the parallel arm resonator at the first stage, thereby causing to generate heat thereat, which in turn causes the comb-shape electrodes to be melted off.

The electric power-resisting property of the receiving filter also relates to the number of comb-shape electrodes constituting the SAW resonator. As has been already explained, the receiving filter is constructed so that the number of pairs in the parallel arm resonator P1 arranged at the first stage is 70 (pairs), and the number of pairs in the series arm resonator S1 is 100 (pairs). In view of the current flowing through each of comb-shape electrodes, the current is in proportion to the reciprocal number of the ratio of the number of pairs in P1 and that in S1. Therefore, the amount of the current that flows through P1 is (100/70=) 1.43 times as large as that of the current that flows through S1. From this facts, it is known that the parallel arm resonator P1 (210) arranged at the first stage is weak in its electric power-resisting property.

As a consequence, since resistance ratio of RP1/RR is about 1.8, it is known that the electric power-resisting property of the parallel arm resonator P1 (210) arranged at a first stage is about 1.8×1.43=2.57 times as weak as that of the series arm resonator S1 arranged at a first stage.

In contrast, according to the preferred embodiments of the present invention, the number of pairs of the finger electrodes of the parallel arm resonator P1 arranged at the first stage is increased, and/or, the interdigitated width of the finger electrodes is made longer, whereby the current flowing through respective comb-shape electrodes is reduced. As a result, the electric power-resisting property of the receiving filter is improved.

Now, the LC values of a lumped parameter equivalent circuit of a resonator are designated as A and B before and after the increase of the number of pairs of the finger electrodes, and/or the increase of the interdigitated width of finger electrodes, respectively. In that case, the LC value A is approximately equal to the LC value B thereby obtaining high performance characteristics of a receiving filter.

TABLE 3 shows the initial characteristics of a receiving filter in a SAW separator for conventional Code Division Multiple Access (CDMA: one of U.S. standards regarding digital automobile and cellular telephones using spectral diffusion technology) and the characteristics after lapse of 300 hours with applied electric power of 2.5 W, while TABLE 4 shows the initial characteristics of a receiving filter in a SAW separator for CDMA according to the present invention, and the characteristics after lapse of 300 hours with applied electric power of 2.5 W.

Figure 7:
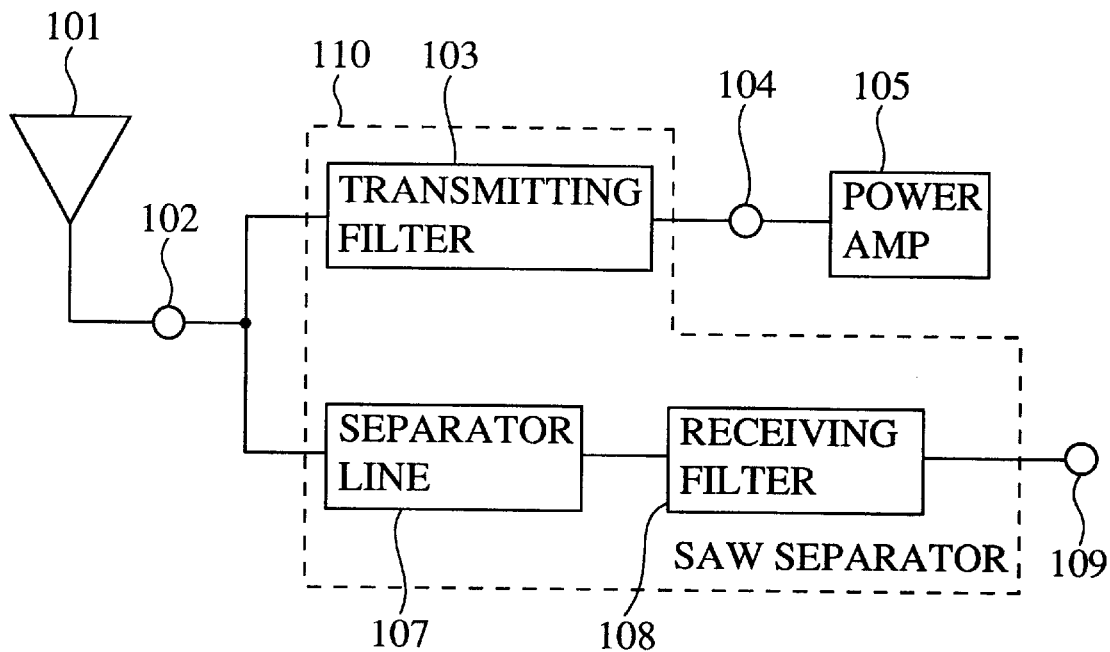
FIG. 7 is a block line diagram showing a main portion in an RF circuit including a SAW separator, in a mobile communication device, for example, a cellular phone.

These data were measured as described below. In the structure shown in FIG. 7, electric power of 2.5 Watt was output to the output terminal 104 in the electric power amplifier 105, and this electric power was applied to the Tx-Filter 103. After lapse of 300 hours in this status with electric power being applied, the transmission amount from the ANT terminal 102 to the output terminal 109 of the Rx-Filter 108 was measured. From these measured data, the results shown in TABLE 3 and TABLE 4 have been obtained, respectively.

TABLE 3

|  | 824 (MHz) | 849 (MHz) | 869 (MHz) | 894 (MHz) |
|---|---|---|---|---|
| Initial | 39.6 dB | 37.4 dB | 3.84 dB | 2.93 dB |
| After 300 H | 40.4 dB | 37.9 dB | 4.24 dB | 2.90 dB |

TABLE 4

|  | 824 (MHz) | 849 (MHz) | 869 (MHz) | 894 (MHz) |
|---|---|---|---|---|
| Initial | 56.2 dB | 51.1 dB | 3.20 dB | 2.97 dB |
| After 300 H | 55.4 dB | 51.4 dB | 3.14 dB | 2.95 dB |

As is clear from the above TABLE 4, according to the receiving filter for a SAW separator of the present invention, (a) at 824 MHz, the initial attenuation amount is 56.2 dB, while attenuation amount after 300 hours appears 55.4 dB, (b) at 849 MHz, the initial attenuation amount is 51.1 dB, while attenuation amount after 300 hours appears 51.4 dB, (c) at 869 MHz, the initial attenuation amount is 3.20 dB, while attenuation amount after 300 hours appears 3.14 dB, and (d) at 894 MHz, the initial attenuation amount is 2.97 dB, while attenuation amount after 300 hours appears 2.95 dB, thus stable characteristics are attained even after lapse of 300 hours, and power electric resistance is improved in comparison with the conventional characteristics in TABLE 3.

As this invention may be embodied in several forms without departing from the spirit of essential characteristics thereof, the above preferred embodiments are therefore illustrative and not restrictive, since the scope of the present invention is defined by the appended claims rather than by the description preceding them, and all changes that fall within meets and bounds of the claims, or equivalence of such as meets and bounds are therefore intended to be embraced by the claims.

For instance, the number of pairs and interdigitated width of finger electrodes of a parallel arm at the first stage are not limited to those shown in the respective preferred embodiments mentioned above. These number of pairs and interdigitated width are basically restricted by the size of a receiving filter. Nevertheless, it is possible to set the number of pairs at, for example, 200 pairs, and to increase the interdigitated width, for example, up to around 200 $\mu$m or more.

As mentioned heretofore, according to the present invention, it is possible to attain the following effects.

The number of pairs of the finger electrodes of the comb-shape electrodes of the parallel arm resonator P1 arranged at the first stage is made larger than that of the finger electrodes of parallel arm resonators at other stages, whereby the current flowing each of the finger electrodes at the first stage may be reduced, and temperature increase may be prevented. Consequently, it is possible to improve the electric power-resisting property.

The interdigitated width of the finger electrodes of the comb-shape electrodes of the parallel arm resonator P1 arranged at the first stage is made longer than that of the finger electrodes of parallel arm resonators at other stages, whereby the current flowing each of the finger electrodes at the first stage may be reduced, and temperature increase may be prevented. Accordingly, it is possible to improve the electric power-resisting property.

The number of pairs and the interdigitated width of the finger electrodes of the comb-shape electrodes of the parallel arm resonator P1 arranged at the first stage are made larger and longer respectively than those of the finger electrodes of parallel arm resonators at other stages, whereby the current flowing each of the finger electrodes at the first stage may be reduced, and temperature increase may be prevented. Accordingly, it is possible to improve the electric power-resisting property.

A series resonating circuit is arranged at the first stage viewed from the input side, wherein two units of parallel arm resonators are connected in series, and the number of pairs of the finger electrodes of the comb-shape electrodes is made larger than that of the finger electrodes of parallel arm resonators at other stages, whereby, the electric voltage that is applied to each of the parallel arm resonators $P_{1-1}$ and $P_{1-2}$ arranged at the first stage viewed from the input side is divided and reduced accordingly. Therefore, the electric current flowing each of the finger electrodes is reduced further, as a consequence, temperature increase may be prevented. Accordingly, it is possible to improve the electric power-resisting property.

A series resonating circuit is arranged at the first stage viewed from the input side, wherein two units of parallel arm resonators are connected in series, and the interdigitated width of the finger electrodes of the comb-shape electrodes is made longer than that of the finger electrodes of the parallel arm resonators at other stages, whereby, the electric voltage that is applied to each of the parallel arm resonators $P_{1-1}$ and $P_{1-2}$ arranged at the first stage is divided and reduced accordingly. Therefore, the electric current flowing each of the finger electrodes may be reduced, as a result, temperature increase may be prevented. Consequently, it is possible to improve the electric power-resisting property.

A series resonating circuit is arranged at the first stage viewed from the input side, wherein two units of parallel arm resonators are connected in series, and the number of pairs and the interdigitated width of the finger electrodes of the comb-shape electrodes are made larger and longer respectively than those of the finger electrodes of the parallel arm resonators at other stages, whereby, the electric voltage that is applied to each of the parallel arm resonators $P_{1-1}$ and $P_{1-2}$ arranged at the first stage is divided and reduced accordingly. Therefore, the current flowing each of the finger electrodes may be reduced, and temperature increase may be prevented. As a consequence, it is possible to improve the electric power-resisting property.

What is claimed is:

1. A receiving filter that is used in a SAW separator and comprises a ladder type filter, wherein
    said ladder type filter has plural stages of series arms and parallel arms wherein each of input side stages thereof is a first stage and each of output side stages thereof is a last stage,
    each of said series arms and parallel arms comprises a SAW resonator,
    said parallel arm at the first stage comprises one SAW resonator as a parallel arm resonator,
    the number of pairs of finger electrodes of said parallel arm resonator is greater than the number of pairs of finger electrodes of parallel arm resonators at other stages, and
    an interdigitated width of said finger electrodes of said parallel arm resonator at the first stage is greater than an interdigitated width of finger electrodes of each of said parallel arm resonators at the other stages.

2. A receiving filter set forth in claim 1, wherein
    said SAW separator includes a transmitting filter, and
    said transmitting filter comprises a ladder type filter whose series arms and parallel arms are formed by SAW resonators, respectively.

3. A receiving filter that is used in a SAW separator and comprises a ladder type filter, wherein
    said ladder type filter has plural stages of series arms and parallel arms wherein each of input side stages thereof is a first stage and each of output side stages thereof is a last stage,
    each of said series arms and parallel arms comprises a SAW resonator,
    said parallel arm at the first stage comprises one SAW resonator as a parallel arm resonator, and
    interdigitated width of said finger electrodes of said parallel arm resonator is greater than interdigitated width of finger electrodes of each of said parallel arm resonators at other stages.

4. A receiving filter set forth in claim 3, wherein
    said SAW separator includes a transmitting filter, and
    said transmitting filter comprises a ladder type filter whose series arms and parallel arms are formed by SAW resonators, respectively.

5. A receiving filter that is used in a SAW separator and comprises a ladder type filter, wherein
    said ladder type filter has plural stages of series arms and parallel arms wherein each of input side stages thereof is a first stage and each of output side stages thereof is a last stage,
    each of said series arms and parallel arms comprises a SAW resonator,
    said parallel arm at the first stage comprises a series circuit of plural SAW resonators,
    the number of pairs of finger electrodes of each of said plural SAW resonators at the first stage is greater than the number of pairs of finger electrodes of each of said parallel arm resonators at other stages, and
    an interdigitated width of said finger electrodes of each of said plural SAW resonators at the first stage is greater than an interdigitated width of finger electrodes of each of said parallel arm resonators at other stages.

6. A receiving filter set forth in claim 5, wherein
    said SAW separator includes a transmitting filter, and
    said transmitting filter comprises a ladder type filter whose series arms and parallel arms are formed by SAW resonators, respectively.

7. A receiving filter set forth in claim 5, wherein said plural SAW resonators at said first stage have the same number of pairs of said finger electrodes.

8. A receiving filter set forth in claim 7, wherein
    said SAW separator includes a transmitting filter, and
    said transmitting filter comprises a ladder type filter whose series arms and parallel arms are formed by SAW resonators, respectively.

9. A receiving filter set forth in claim 5, wherein of said plural SAW resonators at said first stage have the same number of pairs and the same interdigitated width of said finger electrodes.

10. A receiving filter set forth in claim 9, wherein
    said SAW separator includes a transmitting filter, and
    said transmitting filter comprises a ladder type filter whose series arms and parallel arms are formed by SAW resonators, respectively.

11. A receiving filter that is used in a SAW separator and comprises a ladder type filter, wherein
    said ladder type filter has plural stages of series arms and parallel arms wherein each of input side stages thereof is a first stage and each of output side stages thereof is a last stage,
    each of said series arms and parallel arms comprises a SAW resonator,
    said parallel arm at the first stage comprises a series circuit of plural SAW resonators, and
    an interdigitated width of said finger electrodes of each of said plural SAW resonators at the first stage is greater than an interdigitated width of finger electrodes of each of said parallel arm resonators at other stages.

12. A receiving filter set forth in claim 11, wherein
    said SAW separator includes a transmitting filter, and
    said transmitting filter comprises a ladder type filter whose series arms and parallel arms are formed by SAW resonators, respectively.

13. A receiving filter set forth in claim 11, wherein said plural SAW resonators at said first stage have the same interdigitated width of said finger electrodes.

14. A receiving filter set forth in claim 13, wherein
    said SAW separator includes a transmitting filter, and
    said transmitting filter comprises a ladder type filter whose series arms and parallel arms are formed by SAW resonators, respectively.

* * * * *

UNITED STATES PATENT AND TRADEMARK OFFICE
CERTIFICATE OF CORRECTION

PATENT NO.   : 6,208,223 B1                                    Page 1 of 1
DATED        : March 27, 2001
INVENTOR(S)  : Hajime Shimamura et al.

It is certified that error appears in the above-identified patent and that said Letters Patent is hereby corrected as shown below:

<u>Title page,</u>
Item [73], please correct the name of the Assignee as follows:
-- [73] Oki Electric Industry Co., Ltd. Japan --

Signed and Sealed this

Eleventh Day of November, 2003

JAMES E. ROGAN
*Director of the United States Patent and Trademark Office*